US009280052B2

(12) United States Patent
Iwao et al.

(10) Patent No.: US 9,280,052 B2
(45) Date of Patent: Mar. 8, 2016

(54) SUBSTRATE TREATMENT METHOD, NON-TRANSITORY COMPUTER STORAGE MEDIUM AND SUBSTRATE TREATMENT SYSTEM

(71) Applicant: Tokyo Electron Limited, Tokyo (JP)

(72) Inventors: Fumiko Iwao, Nirasaki (JP); Satoru Shimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/177,322

(22) Filed: Feb. 11, 2014

(65) Prior Publication Data

US 2014/0255852 A1 Sep. 11, 2014

(30) Foreign Application Priority Data

Mar. 6, 2013 (JP) ................... 2013-044421

(51) Int. Cl.
G03F 7/38 (2006.01)
G03F 7/26 (2006.01)
H01L 21/027 (2006.01)
H01L 21/67 (2006.01)

(52) U.S. Cl.
CPC *G03F 7/38* (2013.01); *G03F 7/265* (2013.01); *H01L 21/0273* (2013.01); *H01L 21/6715* (2013.01); *H01L 21/6719* (2013.01); *H01L 21/67167* (2013.01)

(58) Field of Classification Search
CPC ........... G03F 7/38; G03F 7/20; H01L 21/283; H05K 3/10
See application file for complete search history.

(56) References Cited

U.S. PATENT DOCUMENTS

| 6,017,683 A * | 1/2000 | Endo et al. ............... 430/326 |
| 2002/0036183 A1 | 3/2002 | Shibata |
| 2004/0081762 A1 | 4/2004 | Tsushima |
| 2012/0152752 A1 | 6/2012 | Keigler et al. |
| 2014/0170332 A1 | 6/2014 | Iwao et al. |
| 2014/0255844 A1 | 9/2014 | Iwao et al. |

FOREIGN PATENT DOCUMENTS

| EP | 1-375-699 | * | 1/2004 |
| JP | H04-151668 A | | 5/1992 |
| JP | H07-326562 A | | 12/1995 |
| JP | 08-076385 A | | 3/1996 |
| JP | 09-189998 A | | 7/1997 |
| JP | 2000-243741 A | | 9/2000 |
| JP | 2001-272786 A | | 10/2001 |

(Continued)

OTHER PUBLICATIONS

Office Action dated Oct. 6, 2014 issued in co-pending U.S. Appl. No. 14/188,774.

(Continued)

*Primary Examiner* — Brittany Raymond
(74) *Attorney, Agent, or Firm* — Posz Law Group, PLC

(57) ABSTRACT

The present invention includes: a resist film forming step of forming a resist film over a substrate; an exposure step of exposing the resist film into a predetermined pattern; a metal treatment step of causing a treatment agent to enter an exposed portion exposed in the exposure step of the resist film and causing metal to infiltrate the exposed portion via the treatment agent; and a resist film removing step of removing an unexposed portion not exposed in the exposure step of the resist film to form a resist pattern over the substrate.

4 Claims, 13 Drawing Sheets

(56) References Cited

FOREIGN PATENT DOCUMENTS

| | | |
|---|---|---|
| JP | 2003-519434 A | 6/2003 |
| JP | 2005-322765 A | 11/2005 |
| JP | 2010-278254 A | 12/2010 |
| JP | 2012-022244 A | 2/2012 |
| WO | 00/01010 A2 | 1/2000 |

OTHER PUBLICATIONS

Final Office Action dated Jan. 16, 2015 issued in co-pending U.S. Appl. No. 14/188,774.

U.S. Office Action mailed on Sep. 30, 2015 in the corresponding U.S. Appl. No. 14/098,653.

* cited by examiner (a)

(b)

(c)

SUBSTRATE TREATMENT METHOD, NON-TRANSITORY COMPUTER STORAGE MEDIUM AND SUBSTRATE TREATMENT SYSTEM

BACKGROUND OF THE INVENTION

1. Field of the Invention

The present invention relates to a substrate treatment method, a non-transitory computer storage medium, and a substrate treatment system for executing the substrate treatment method.

This application is based upon and claims the benefit of priority of the prior Japanese Patent Application No. 2013-44421, filed in Japan on Mar. 6, 2013, the entire contents of which are incorporated herein by reference.

2. Description of the Related Art

In a photolithography process in a manufacturing process of a semiconductor device, for example, a resist coating treatment of applying a resist solution onto a semiconductor wafer (hereinafter, referred to as a "wafer") to form a resist film, exposure processing of irradiating the resist film over the wafer front surface with light in a predetermined pattern to expose the resist film, a developing treatment of developing the exposed resist film and so on are performed in sequence to form a predetermined resist pattern in the resist film over the wafer front surface.

The aforementioned developing treatment is performed, for example, by supplying a developing solution onto the resist film over the wafer. In this case, a so-called pattern collapse in which the resist pattern tilts to collapse arises due to the surface tension of the developing solution affecting the resist pattern.

Hence, it is proposed that the developing treatment is performed using a developing solution with a surface tension decreased by mixing an organic solvent in an undiluted developing solution (Japanese Laid-open Patent Publication No. 2012-22244).

However, in the case of performing the developing treatment using the developing solution described in Japanese Laid-open Patent Publication No. 2012-22244, the pattern collapse can be suppressed correspondingly to the decrease in surface tension of the developing solution, but there is still room for improvement in practice.

In particular, semiconductor devices in recent years are miniaturized to be, for example, 20 nm or less, and resist patterns are being miniaturized. In other words, the aspect ratio of the resist pattern increases. Therefore, a problem of the pattern collapse becomes prominent, and it is necessary to suppress the pattern collapse so as to appropriately form a resist pattern also from this viewpoint.

SUMMARY OF THE INVENTION

The present invention has been made in consideration of the above points, and its object is to appropriately form a resist pattern over a substrate.

To achieve the above object, the present invention is a substrate treatment method of forming a resist pattern over a substrate, the method including: a resist film forming step of forming a resist film over a substrate; an exposure step of exposing the resist film into a predetermined pattern; a metal treatment step of causing a treatment agent to enter an exposed portion exposed in the exposure step of the resist film and causing metal to infiltrate the exposed portion via the treatment agent; and a resist film removing step of removing an unexposed portion not exposed in the exposure step of the resist film to form a resist pattern over the substrate.

According to the present invention, by exposing the resist film in the exposure step, OH groups (hydroxyl groups) are generated in the exposed portion of the resist film. Thereafter, in the metal treatment step, the treatment agent enters the exposed portion targeting functional groups having affinity therefor such as the OH groups in the exposed portion. Along with the entrance of the treatment agent into the exposed portion, metal also enters the exposed portion using the treatment agent as an entrance route. Thereafter, by removing the unexposed portion of the resist film in the resist film removing step, the exposed portion which the metal has infiltrated remains to form into a resist pattern over the substrate. As described above, according to the present invention, it is possible to omit the developing treatment using a developing solution as in the prior art and thereby suppress the pattern collapse, so that the resist pattern can be appropriately formed over the substrate.

In addition, the resist pattern of the present invention contains metal and thus has a high etching selection ratio with respect to the film to be treated on the substrate. Accordingly, it is unnecessary to form a resist pattern with a high aspect ratio and thereby can suppress the pattern collapse also from this viewpoint.

Further, the resist pattern has a high etching selection ratio with respect to the film to be treated as described above, so that when the film to be treated is etched using the resist pattern as a mask, a predetermined pattern can be appropriately formed in the film to be treated.

The present invention according to another aspect is a non-transitory computer readable storage medium storing a program running on a computer of a control unit that controls a substrate treatment system to cause the substrate treatment system to execute the substrate treatment method.

The present invention according to still another aspect is a substrate treatment system for forming a resist pattern over a substrate, the system including: a resist film forming apparatus configured to form a resist film over a substrate; an exposure apparatus configured to expose the resist film into a predetermined pattern; a metal treatment apparatus configured to cause a treatment agent to enter an exposed portion exposed in the exposure apparatus of the resist film and cause metal to infiltrate the exposed portion via the treatment agent; and a resist film removing apparatus configured to remove an unexposed portion not exposed in the exposure apparatus of the resist film to form a resist pattern over the substrate.

DETAILED DESCRIPTION OF THE INVENTION

Figure 1:
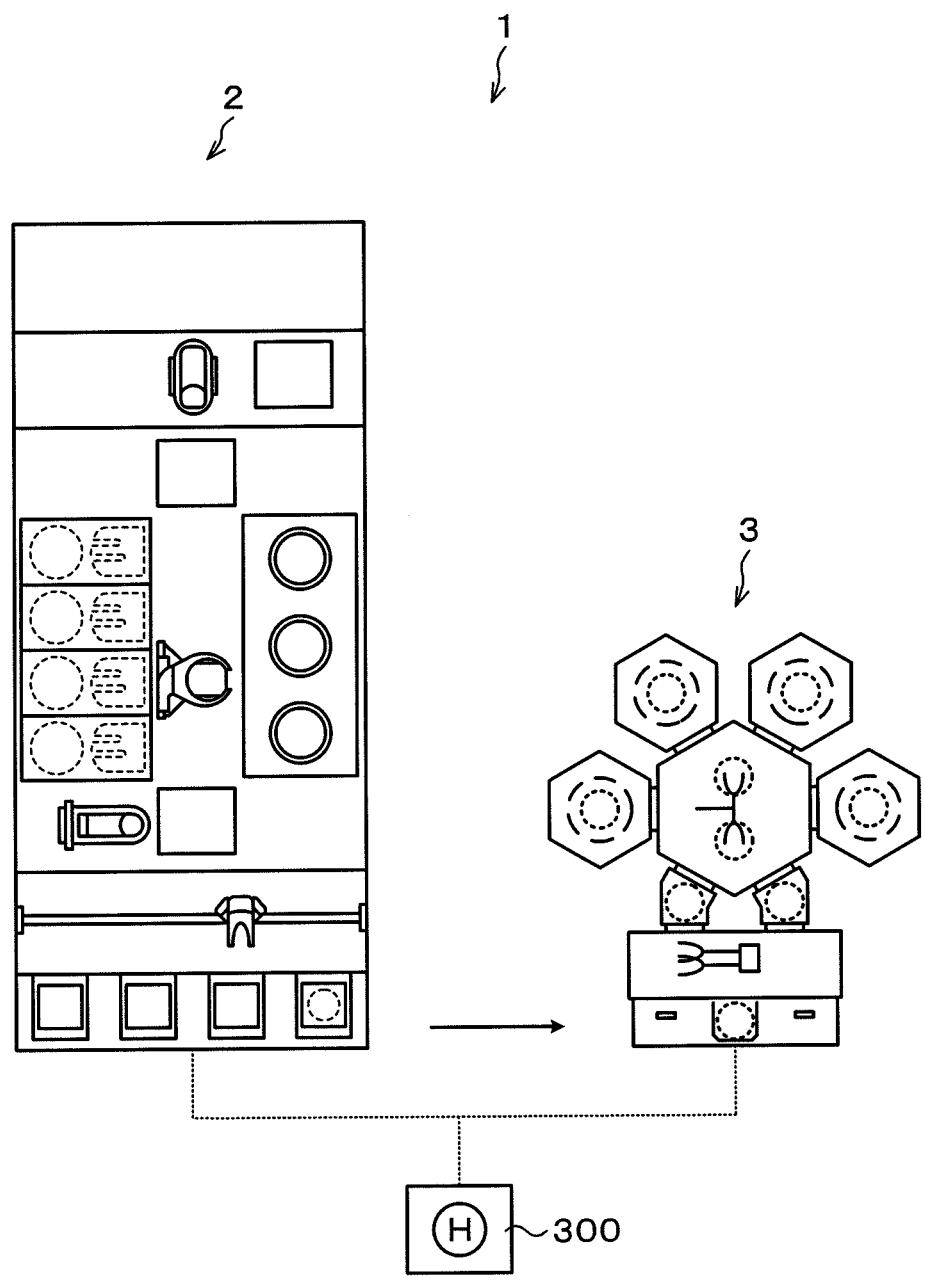
FIG. 1 is an explanatory view illustrating the outline of a configuration of a substrate treatment system according an embodiment.

Hereinafter, an embodiment of the present invention will be described. FIG. 1 is an explanatory view illustrating the outline of a configuration of a substrate treatment system 1 according to this embodiment. Note that a film to be treated has been preliminarily formed on a wafer as a substrate to be treated in the substrate treatment system 1 according to this embodiment.

The substrate treatment system 1 has a coating and developing treatment apparatus 2 that performs photolithography processing (except a developing treatment) on the wafer and an etching treatment apparatus 3 that performs etching treatment on the wafer W as illustrated in FIG. 1.

Figure 2:
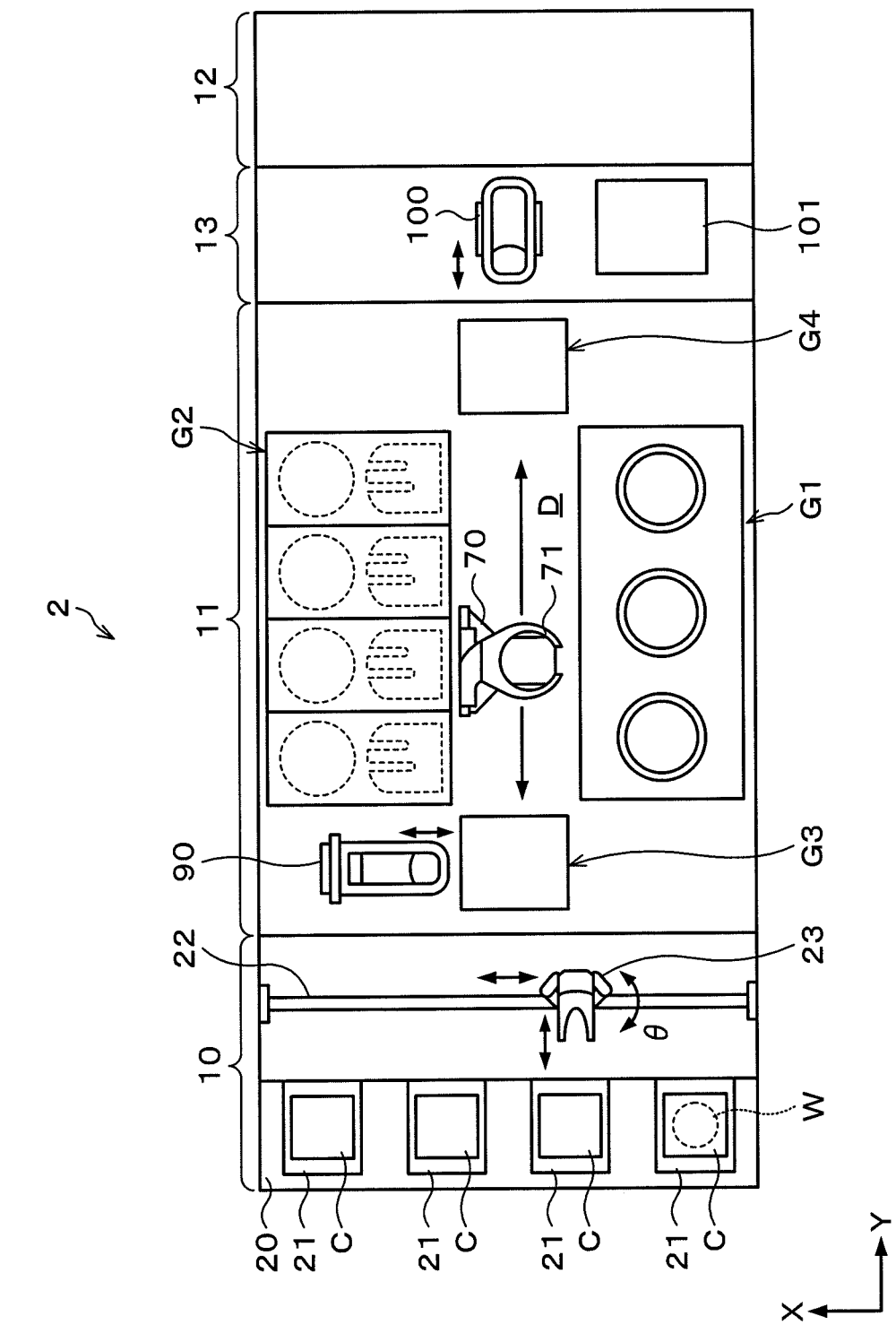
FIG. 2 is a plan view illustrating the outline of a configuration of a coating and developing treatment apparatus.

The coating and developing treatment apparatus 2 has, as illustrated in FIG. 2, a configuration in which, for example, a cassette station 10 to/from which a cassette C housing a plurality of wafers W is transferred in/out from/to, for example, the outside, a treatment station 11 including a plurality of various kinds of treatment apparatuses that perform predetermined treatments in a manner of single wafer treatment in the photolithography processing, and an interface station 13 that delivers the wafer W to/from an exposure apparatus 12 adjacent to the treatment station 11, are integrally connected.

In the cassette station 10, a cassette mounting table 20 is provided. The cassette mounting table 20 is provided with, a plurality of, for example, four cassette mounting plates 21. The cassette mounting plates 21 are provided, arranged side by side in a line in an X-direction (a top and bottom direction in FIG. 2) being the horizontal direction. On the cassette mounting plates 21, cassettes C can be mounted when the cassettes C are transferred in/out from/to the outside of the coating and developing treatment apparatus 2.

In the cassette station 10, a wafer transfer apparatus 23 is provided which is movable on a transfer path 22 extending in the X-direction as illustrated in FIG. 2. The wafer transfer apparatus 23 is movable also in the vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (an X-direction negative direction side in FIG. 2) in the treatment station 11, and the second block G2 is provided on the rear side (an X-direction positive direction side in FIG. 2) in the treatment station 11. Further, the third block G3 is provided on the cassette station 10 side (a Y-direction negative direction side in FIG. 2) in the treatment station 11, and the fourth block G4 is provided on the interface station 13 side (a Y-direction positive direction side in FIG. 2) in the treatment station 11.

Figure 3:
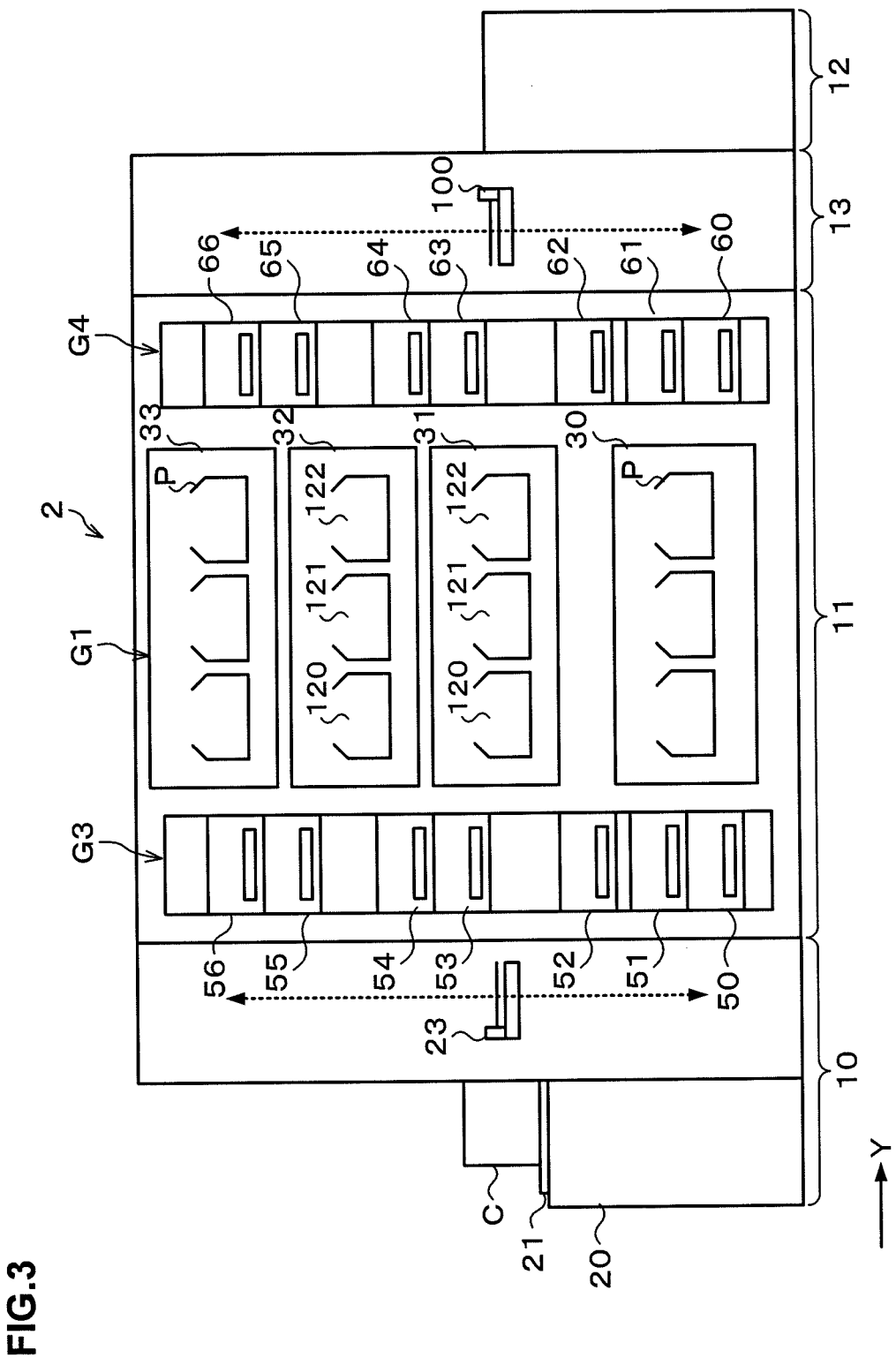
FIG. 3 is a side view illustrating the outline of an internal configuration of the coating and developing treatment apparatus.

For example, in the first block G1, as illustrated in FIG. 3, a plurality of solution treatment apparatuses are stacked in the vertical direction. For example, a lower anti-reflection film forming apparatus 30 which forms an anti-reflection film under a resist film of the wafer W (hereinafter, referred to as a "lower anti-reflection film"), coating treatment apparatuses 31, 32 each of which applies a resist solution to the wafer W to form a resist film and applies a predetermined solution to the resist film to cause metal to infiltrate the resist film, and an upper anti-reflection film forming apparatus 33 which forms an anti-reflection film over the resist film over the wafer W (hereinafter, referred to as an "upper anti-reflection film"), are four-tiered in order from the bottom. Note that the coating treatment apparatuses 31, 32 function as resist film forming apparatuses in the present invention and function as metal treatment apparatuses.

Each of the lower anti-reflection film forming apparatus 30 and the upper anti-reflection film forming apparatus 33 has a plurality of cups P, each of which houses the wafer W therein at treatment, in the horizontal direction, and can treat a plurality of wafers W in parallel. The detailed configurations of the coating treatment apparatuses 31, 32 will be described later.

The numbers and the arrangement of the lower anti-reflection film forming apparatus 30, the coating treatment apparatuses 31, 32, and the upper anti-reflection film forming apparatus 33 can be arbitrarily selected. Further, a protective film forming apparatus which supplies a treatment solution for forming a water repellent protective film to the wafer W to form a protective film for exposure, a rear surface cleaning apparatus which supplies a cleaning solution to a rear surface and a beveled portion at the edge of the wafer W to clean the rear surface of the wafer W, and the like may be arranged in the first block G1.

Figure 4:
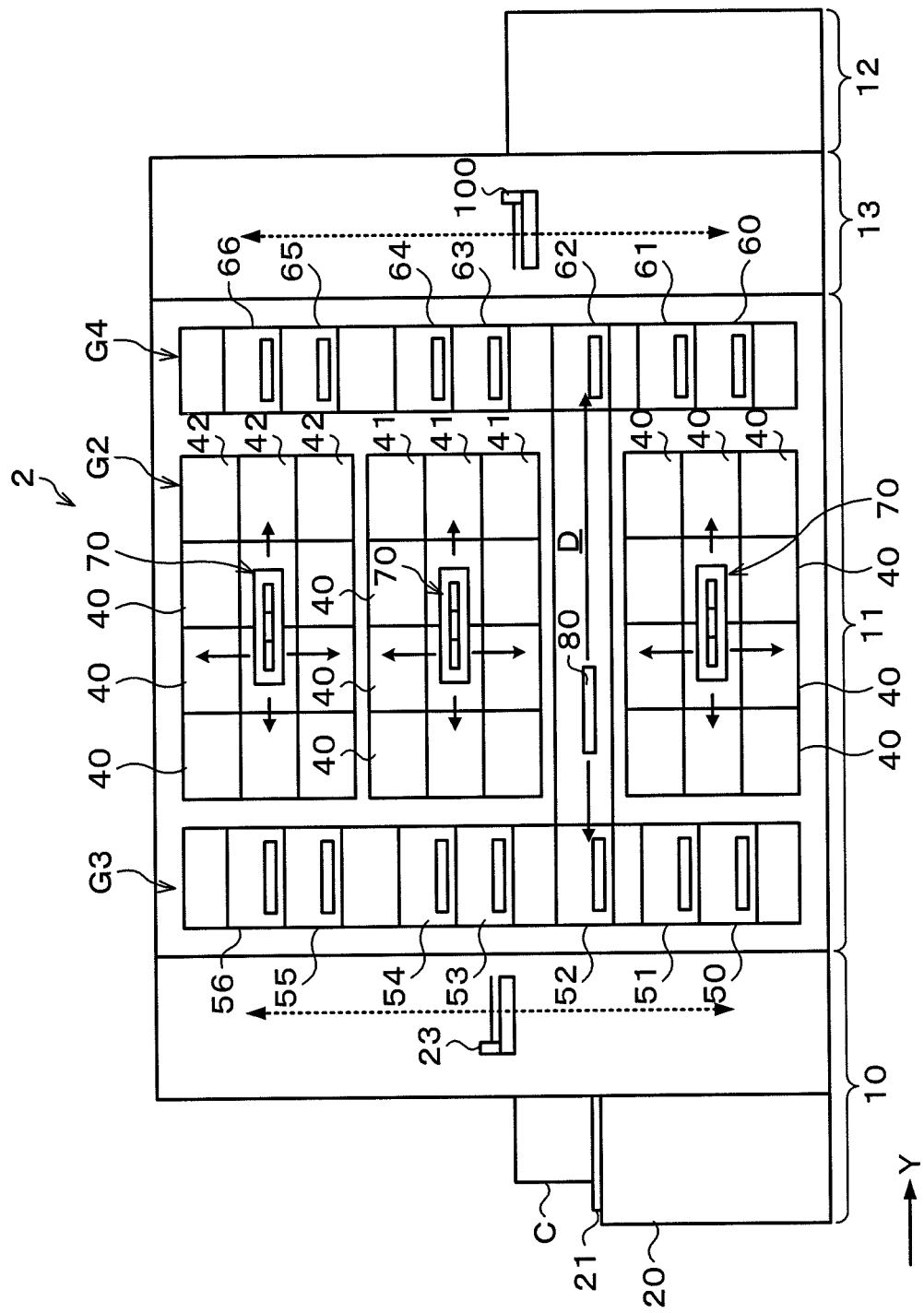
FIG. 4 is a side view illustrating the outline of the internal configuration of the coating and developing treatment apparatus.

For example, in the second block G2, as illustrated in FIG. 4, thermal treatment apparatuses 40 each of which performs thermal treatment on the wafer W, adhesion apparatuses 41 each of which performs hydrophobic treatment on the wafer W, and edge exposure apparatuses 42 each of which exposes the outer peripheral portion of the wafer W are arranged one on top of the other in the vertical direction and side by side in the horizontal direction. The thermal treatment apparatus 40 has a thermal plate which mounts and heats the wafer W thereon and a cooling plate which mounts and cools the wafer W thereon, and thereby can perform both of heat treatment and cooling treatment. Note that the numbers and the arrangement of the thermal treatment apparatuses 40, the adhesion apparatuses 41, and the edge exposure apparatuses 42 can be arbitrarily selected.

For example, in the third block G3, a plurality of delivery apparatuses 50, 51, 52, 53, 54, 55, 56 are provided in order from the bottom as illustrated in FIG. 3 and FIG. 4. Further, in the fourth block G4, a plurality of delivery apparatuses 60, 61, 62, 63, 64, 65, 66 are provided in order from the bottom.

A wafer transfer region D is formed in a region surrounded by the first block G1 to the fourth block G4 as illustrated in FIG. 2. In the wafer transfer region D, for example, a wafer transfer apparatus 70 is arranged.

The wafer transfer apparatus 70 has a transfer arm 71 that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

A plurality of the wafer transfer apparatuses 70 are arranged, for example, one above the other as illustrated in FIG. 4 and can transfer the wafers W, for example, to predetermined apparatuses in the blocks G1 to G4 at about the same levels as them.

In the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction. The shuttle transfer apparatus 80 can move in the Y-direction while supporting the wafer W and transfer the wafer W between the delivery apparatus 52 in the third block G3 and the delivery apparatus 62 in the fourth block G4.

As illustrated in FIG. 2, a wafer transfer apparatus 90 is provided on the X-direction positive direction side of the third block G3. The wafer transfer apparatus 90 has a transfer arm that is movable, for example, in the X-direction, the θ-direction, and the vertical direction. The wafer transfer apparatus 90 can move up and down while supporting the wafer W to transfer the wafer W to each of the delivery apparatuses in the third block G3.

In the interface station 13, a wafer transfer apparatus 100 and a delivery apparatus 101 are provided. The wafer transfer apparatus 100 has a transfer arm that is movable, for example, in the Y-direction, the θ-direction, and the vertical direction. The wafer transfer apparatus 100 can transfer the wafer W to/from each of the delivery apparatuses in the fourth block G4, the delivery apparatus 101 and the exposure apparatus 12 while supporting the wafer W by the transfer arm.

Figure 5:
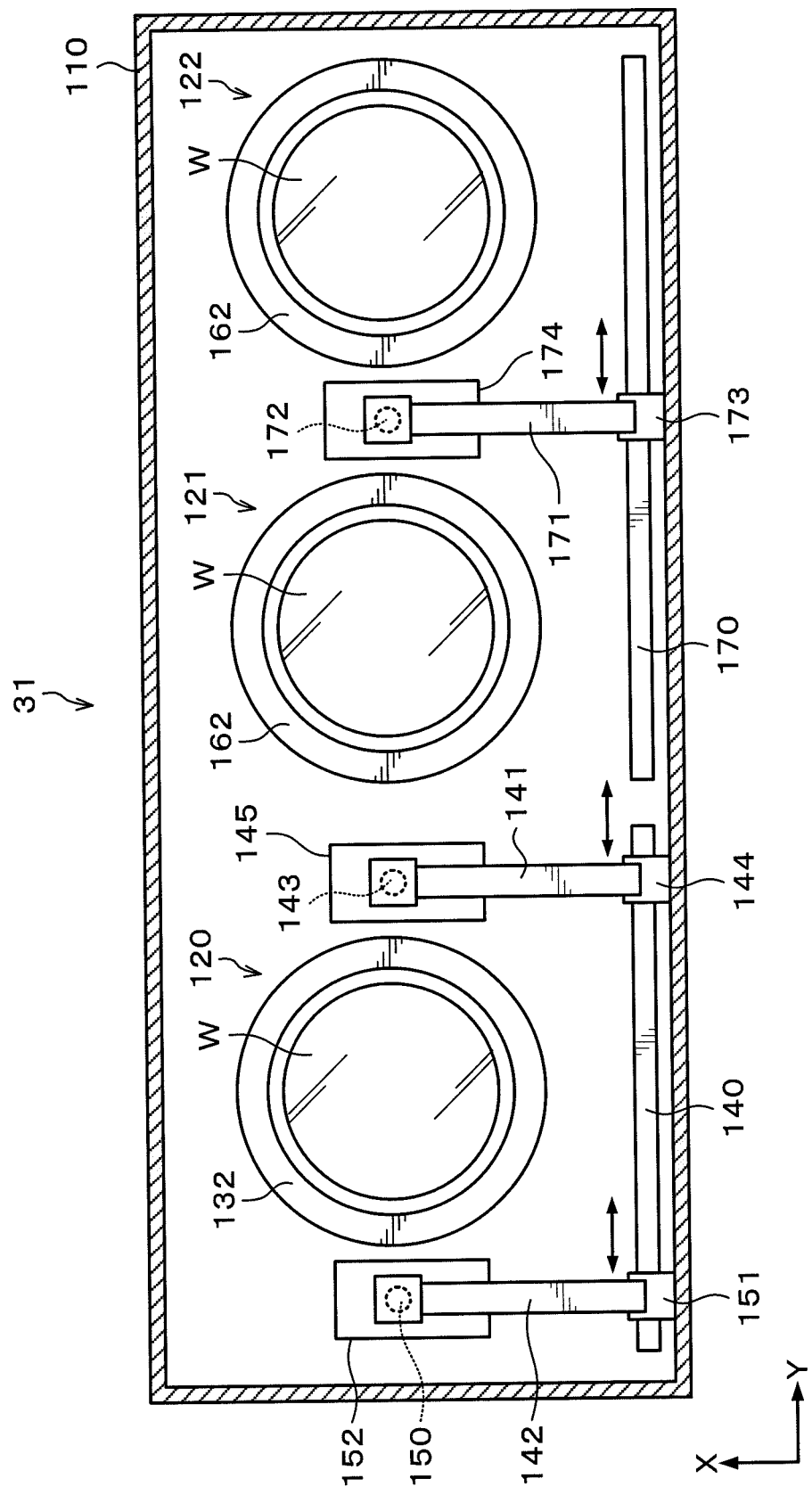
FIG. 5 is a transverse sectional view illustrating the outline of a configuration of a coating treatment apparatus.

Next, the configurations of the above-described coating treatment apparatuses 31, 32 will be described. The coating treatment apparatus 31 has a treatment container 110 which can hermetically close the inside as illustrated in FIG. 5. Transfer-in/out ports (not illustrated) for the wafers W are formed, for example, at three positions in a side surface on the wafer transfer region D side of the treatment container 110, and opening/closing shutters (not illustrated) are provided at the transfer-in/out ports. The three transfer-in/out ports are formed at positions corresponding to later-described metal treatment unit 120 and resist film forming units 121, 122. Note that the metal treatment unit 120 functions as a metal treatment apparatus in the present invention, and the resist film forming units 121, 122 function as the resist film forming apparatuses in the present invention.

Inside the treatment container 110, for example, the metal treatment unit 120 which causes alcohol as a treatment agent to enter an exposed portion which has been exposed in the exposure apparatus 12 of the resist film over the wafer W and causes metal to infiltrate the exposed potion via the alcohol, and the two resist film forming units 121, 122 each of which forms the resist film over the wafer W are provided. The metal treatment unit 120 and the resist film forming units 121, 122 are arranged side by side in this order from a Y-direction negative direction (a left direction in FIG. 5) side to a Y-direction positive direction (a right direction in FIG. 5) side.

Figure 6:
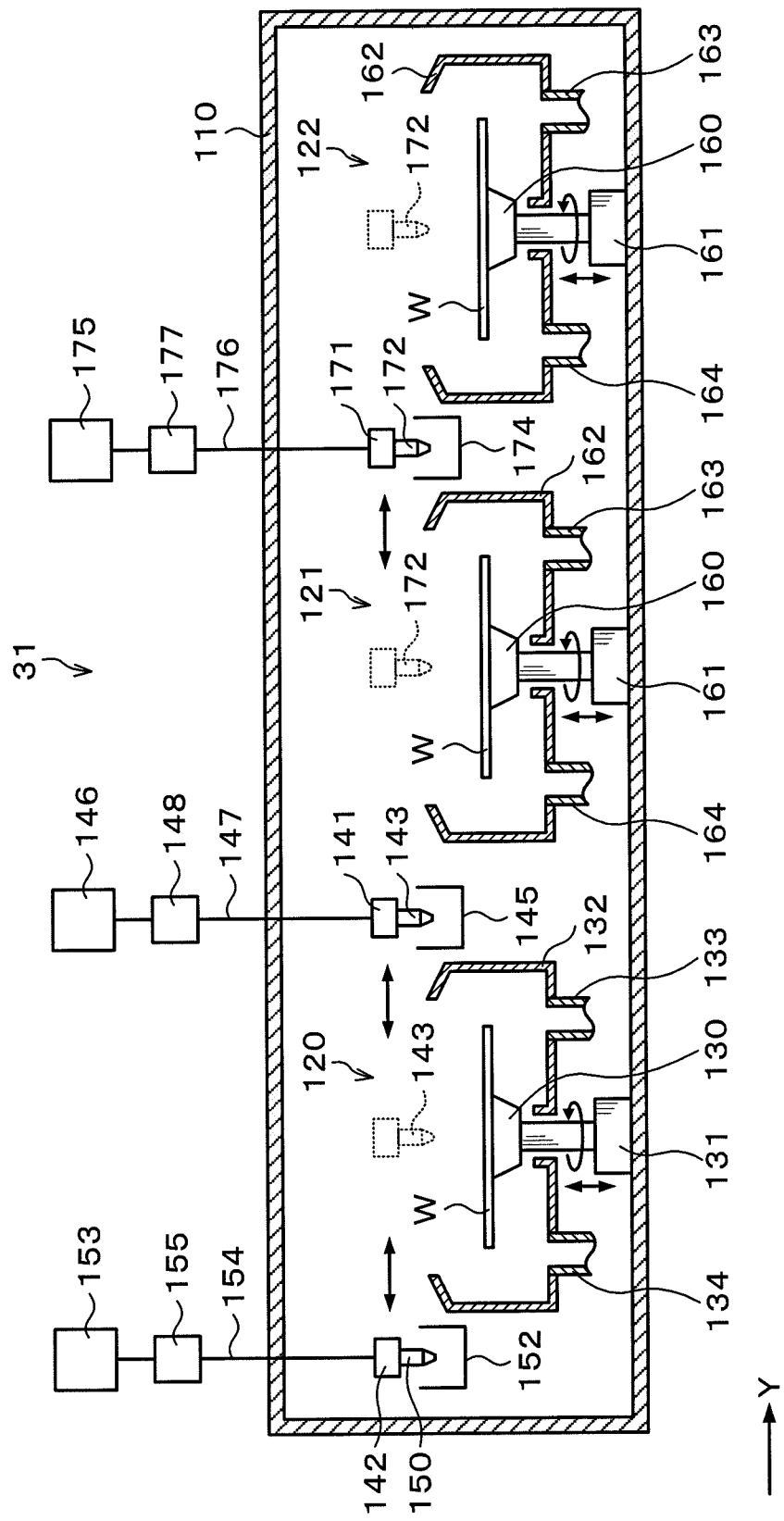
FIG. 6 is a longitudinal sectional view illustrating the outline of the configuration of the coating treatment apparatus.

At the metal treatment unit 120, a spin chuck 130 is provided which holds and rotates the wafer W thereon as illustrated in FIG. 6. The spin chuck 130 has a horizontal upper surface, and the upper surface is provided with, for example, a suction port (not illustrated) sucking the wafer W. By suction through the suction port, the wafer W can be suction-held on the spin chuck 130.

Below the spin chuck 130, a chuck drive part 131 equipped with, for example, a motor and the like is provided. The spin chuck 130 can rotate at a predetermined speed by means of the chuck drive part 131. Further, the chuck drive part 131 is provided with a raising and lowering drive source such as, for example, a cylinder so that the spin chuck 130 can freely rise and lower.

Around the spin chuck 130, a cup 132 is provided which receives and collects liquid splashing or dropping from the wafer W. A drain pipe 133 that drains the collected liquid and an exhaust pipe 134 that exhausts the atmosphere in the cup 132 are connected to the lower surface of the cup 132.

As illustrated in FIG. 5, on an X-direction negative direction (a lower direction in FIG. 5) side of the cup 132, a rail 140 extending along a Y-direction (a right-left direction in FIG. 5) is formed. The rail 140 is formed, for example, from a Y-direction negative direction (a left direction in FIG. 5) side outer position of the cup 132 to a Y-direction positive direction (a right direction in FIG. 5) side outer position. To the rail 140, for example, two arms 141, 142 are attached.

On the first arm 141, a metal-containing solution nozzle 143 as a metal-containing agent supply part is supported which supplies a metal-containing solution in a liquid form as a metal-containing agent onto the wafer W as illustrated in FIG. 5 and FIG. 6. The first arm 141 is movable on the rail 140 by means of a nozzle drive part 144 illustrated in FIG. 5. Thus, the metal-containing solution nozzle 143 can move from a waiting section 145 provided at the Y-direction positive direction side outer position of the cup 132 to a position above a central portion of the wafer W in the cup 132, and further move in the diameter direction of the wafer W above the wafer W. Further, the first arm 141 can freely rise and lower by means of the nozzle drive part 144 to be able to adjust the height of the metal-containing solution nozzle 143.

To the metal-containing solution nozzle 143, a supply pipe 147 communicating with a metal-containing solution supply source 146 is connected as illustrated in FIG. 6. In the metal-containing solution supply source 146, the metal-containing solution is stored. The supply pipe 147 is provided with a supply equipment group 148 including a valve, a flow regulator and so on for controlling the flow of the metal-containing solution.

In the metal-containing solution supply source 146, the metal-containing solution made by dissolving metal in alcohol as a treatment agent is stored. As the alcohol, for example, IPA (isopropyl alcohol), ethanol, butanol, MIBC (methyl isobutyl carbinol) or the like is used. Further, as the metal, for example, Zr (zirconium), Ti (titanium), W (tungsten) or the like is used. Note that this metal is a nanoparticle having a small diameter, for example, a diameter of 5 nm or less.

On the second arm 142, a cleaning solution nozzle 150 is supported which supplies a cleaning solution to the wafer W as illustrated in FIG. 5 and FIG. 6. The second arm 142 is movable on the rail 140 by means of a nozzle drive part 151 illustrated in FIG. 5. Thus, the cleaning solution nozzle 150 can move from a waiting section 152 provided at a Y-direction negative direction side outer position of the cup 132 to a position above a central portion of the wafer W in the cup 132, and further move in the diameter direction of the wafer W above the wafer W. Further, the second arm 142 can freely rise and lower by means of the nozzle drive part 151 to be able to adjust the height of the cleaning solution nozzle 150.

To the cleaning solution nozzle 150, a supply pipe 154 communicating with a cleaning solution supply source 153 is connected as illustrated in FIG. 6. In the cleaning solution supply source 153, alcohol, for example, IPA (isopropyl alcohol), ethanol, butanol, MIBC (methyl isobutyl carbinol) or the like is stored as the cleaning solution. The supply pipe 154 is provided with a supply equipment group 155 including a valve, a flow regulator and so on for controlling the flow of the cleaning solution.

At the resist film forming unit 121, a spin chuck 160 is provided which holds and rotates the wafer W thereon as illustrated in FIG. 6. The spin chuck 160 has a horizontal upper surface, and the upper surface is provided with, for example, a suction port (not illustrated) sucking the wafer W. By suction through the suction port, the wafer W can be suction-held on the spin chuck 160.

Below the spin chuck 160, a chuck drive part 161 equipped with, for example, a motor and the like is provided. The spin chuck 160 can rotate at a predetermined speed by means of the chuck drive part 161. Further, the chuck drive part 161 is provided with a raising and lowering drive source such as, for example, a cylinder so that the spin chuck 160 can freely rise and lower.

Around the spin chuck 160, a cup 162 is provided which receives and collects liquid splashing or dropping from the wafer W. A drain pipe 163 that drains the collected liquid and an exhaust pipe 164 that exhausts the atmosphere in the cup 162 are connected to the lower surface of the cup 162.

Also in the resist film forming unit 122, a spin chuck 160, a chuck drive part 161, a cup 162, a drain pipe 163, and an exhaust pipe 164 are provided as in the above-described resist film forming unit 121.

As illustrated in FIG. 5, on an X-direction negative direction (a lower direction in FIG. 5) side of the cups 162 of the resist film forming units 121, 122, a rail 170 extending along the Y-direction (the right-left direction in FIG. 5) is formed. The rail 170 is formed, for example, from a Y-direction negative direction (a left direction in FIG. 5) side outer position of the cup 162 of the resist film forming unit 121 to a Y-direction positive direction (a right direction in FIG. 5) side outer position of the cup 162 of the resist film forming unit 122. To the rail 170, for example, an arm 171 is attached.

On the arm 171, a resist solution nozzle 172 is supported which supplies a resist solution to the wafer W as illustrated in FIG. 5 and FIG. 6. The arm 171 is movable on the rail 170 by means of a nozzle drive part 173 illustrated in FIG. 5. Thus, the resist solution nozzle 172 can move from a waiting section 174 provided between the cup 162 of the resist film forming unit 121 and the cup 162 of the resist film forming unit 122 to a position above a central portion of the wafer W in the cup 162, and further move in the diameter direction of the wafer W above the wafer W. Further, the arm 171 can freely rise and lower by means of the nozzle drive part 173 to be able to adjust the height of the resist solution nozzle 172.

To the resist solution nozzle 172, a supply pipe 176 communicating with a resist solution supply source 175 is connected as illustrated in FIG. 6. In the resist solution supply source 175, the resist solution is stored. The supply pipe 176 is provided with a supply equipment group 177 including a valve, a flow regulator and so on for controlling the flow of the resist solution.

Note that the configuration of the coating treatment apparatus 32 is the same as that of the above-described coating treatment apparatus 31, and therefore description thereof is omitted.

Figure 7:
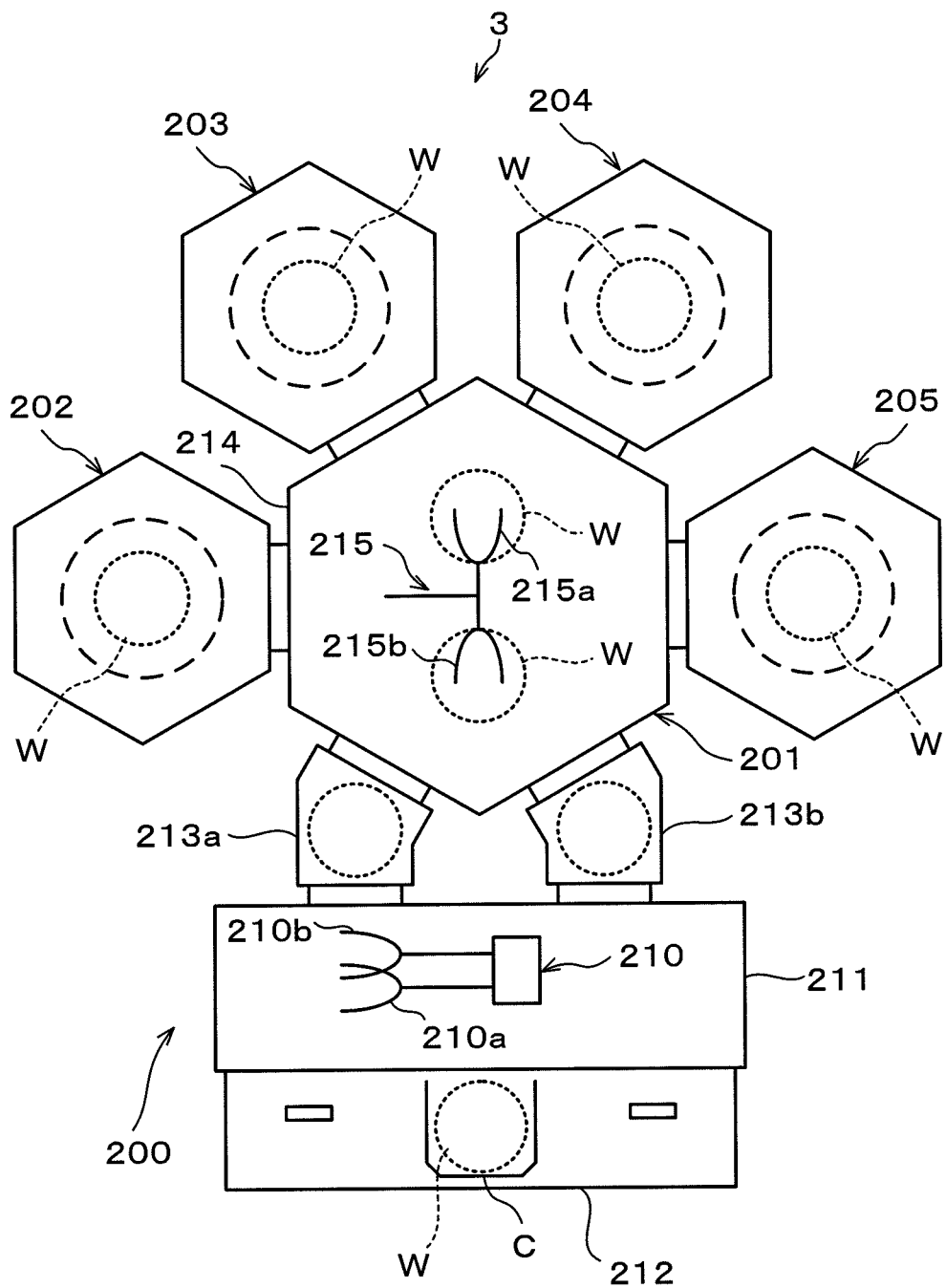
FIG. 7 is a plan view illustrating the outline of a configuration of an etching treatment apparatus.

Next, the configuration of the aforementioned etching treatment apparatus 3 will be described. The etching treatment apparatus 3 has, as illustrated in FIG. 7, a cassette station 200 to/from which the wafer W is transferred in/out to/from the etching treatment apparatus 3, a common transfer unit 201 that transfers the wafer W, first etching apparatuses 202, 203 as resist film removing apparatuses each of which removes an unexposed portion which has not been exposed in the exposure apparatus 12 of the resist film over the wafer W and thereby forms a resist pattern over the wafer W, and second etching apparatuses 204, 205 each of which etches a film to be treated into a predetermined pattern using the resist pattern over the wafer W as a mask.

The cassette station 200 has a transfer room 211 in which a wafer transfer mechanism 210 that transfers the wafer W is provided. The wafer transfer mechanism 210 has two transfer arms 210a and 210b each of which substantially horizontally holds the wafer W, and is configured to transfer the wafer W while holding the wafer W by one of the transfer arms 210a and 210b. On the side of the transfer room 211, a cassette mounting table 212 is provided on which a cassette C capable of housing a plurality of wafers W one above the other therein is mounted. In the illustrated example, a plurality of, for example, three cassettes C can be mounted on the cassette mounting table 212.

The transfer room 211 and the common transfer unit 201 are coupled to each other via two load-lock apparatuses 213a and 213b which can be evacuated.

The common transfer unit 201 has a transfer room chamber 214 having a closable structure formed in a substantially polygonal shape (a hexagonal shape in the illustrated example) as seen from above. In the transfer room chamber 214, a wafer transfer mechanism 215 that transfers the wafer W is provided. The wafer transfer mechanism 215 has two transfer arms 215a and 215b each of which substantially horizontally holds the wafer W, and is configured to transfer the wafer W while holding the wafer W by one of the transfer arms 215a and 215b.

Outside the transfer room chamber 214, the first etching apparatuses 202, 203, the second etching apparatuses 204, 205, and the load-lock apparatuses 213b, 213a are arranged to surround the periphery of the transfer room chamber 214. The first etching apparatuses 202, 203, the second etching apparatuses 204, 205, and the load-lock apparatuses 213b, 213a are arranged, for example, in this order in the clockwise direction as seen from above and opposed to six side surface portions of the transfer room chamber 214 respectively.

Note that as the first etching apparatuses 202, 203 and the second etching apparatuses 204, 205, for example, RIE (Reactive Ion Etching) apparatuses are used. Namely, in each of the first etching apparatuses 202, 203 and the second etching apparatuses 204, 205, dry etching of etching the resist film or the film to be treated is performed with reactive gas (etching gas), ion, or radical.

In the above substrate treatment system 1, a control unit 300 is provided as illustrated in FIG. 1. The control unit 300 is, for example, a computer and has a program storage unit (not illustrated). In the program storage unit, a program that controls the treatment on the wafer W in the substrate treatment system 1 is stored. Note that the program may be the one which is recorded, for example, on a non-transitory computer-readable storage medium such as a computer-readable hard disk (HD), flexible disk (FD), compact disk (CD), magneto-optical disk (MO), or memory card, and installed from the storage medium into the control unit 300.

Figure 8:
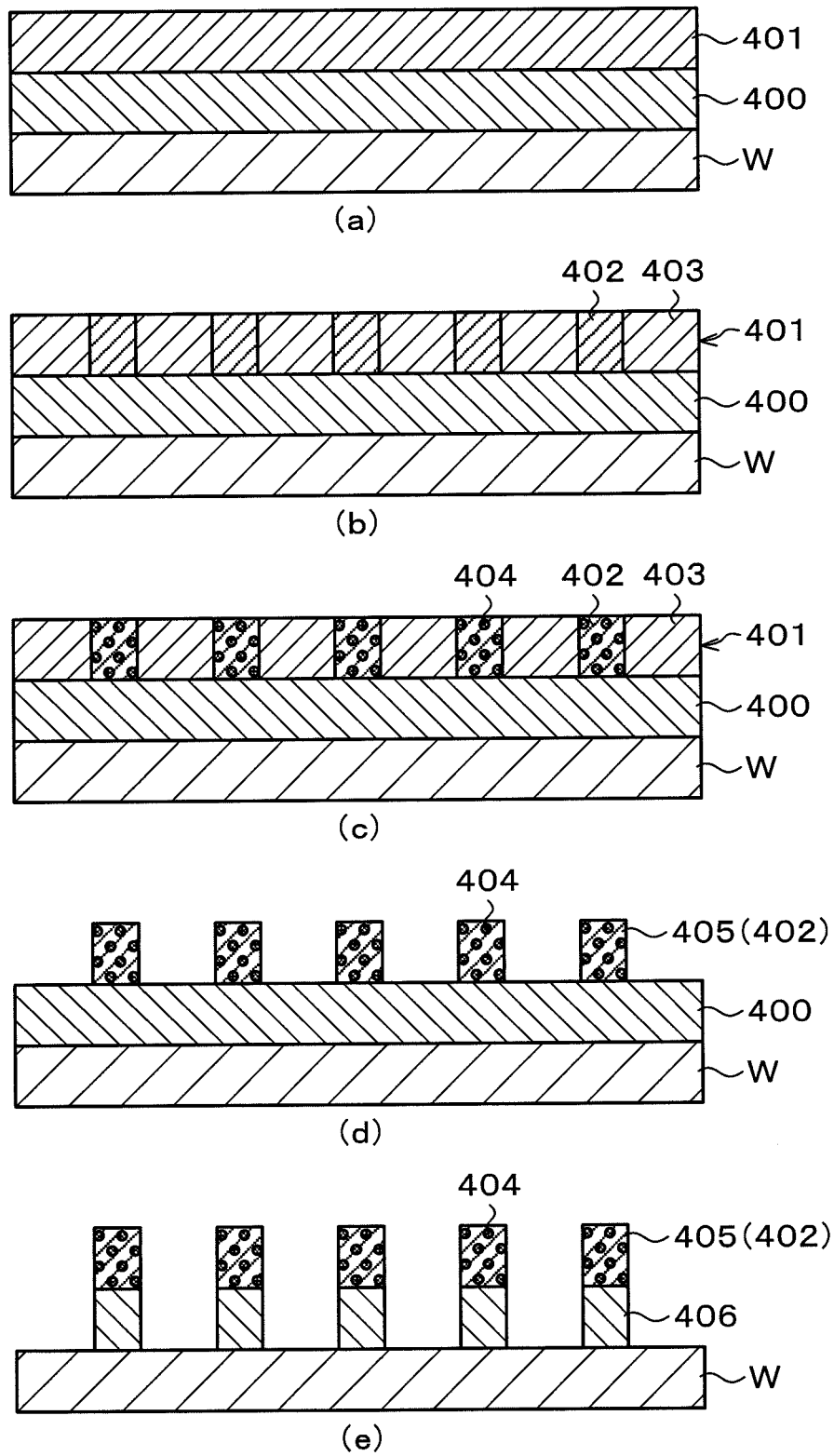
FIG. 8 is an explanatory view of a wafer treatment, (a) illustrating an appearance in which a resist film is formed over a wafer, (b) illustrating an appearance in which the resist film is exposed, (c) illustrating an appearance in which metal infiltrates an exposed portion of the resist film, (d) illustrating an appearance in which a resist pattern is formed over the wafer, and (e) illustrating an appearance in which a predetermined pattern is formed in a film to be treated.

Next, a treatment method of the wafer W performed using the substrate treatment system 1 configured as described above will be described. FIG. 8 schematically illustrates the state of the wafer W in steps of the wafer treatment. Note that as illustrated in FIG. 8(*a*), a film to be treated 400 has been preliminarily formed on the wafer W which will be treated in the substrate treatment system 1.

First, the cassette C housing a plurality of wafers W is transferred into the cassette station 10 of the coating and developing treatment apparatus 2 and mounted on a predetermined cassette mounting plate 21. Then, the wafers W in the cassette C are sequentially taken out by the wafer transfer apparatus 23 and transferred, for example, to the delivery apparatus 50 in the treatment station 11.

Then, the wafer W is transferred by the wafer transfer apparatus 70 to the thermal treatment apparatus 40 and temperature-regulated. Thereafter, the wafer W is transferred by the wafer transfer apparatus 70 to the lower anti-reflection film forming apparatus 30, in which a lower anti-reflection film is formed over the wafer W. The wafer W is then transferred to the thermal treatment apparatus 40 and heated and temperature-regulated, and then returned back to the delivery apparatus 51.

Then, the wafer W is transferred by the wafer transfer apparatus 90 to the delivery apparatus 53. Thereafter, the wafer W is transferred by the wafer transfer apparatus 70 to the adhesion apparatus 41 and subjected to an adhesion treatment. The wafer W is then transferred by the wafer transfer apparatus 70 to the thermal treatment apparatus 40 and temperature-regulated. The wafer W is then transferred by the wafer transfer apparatus 70 to the resist film forming unit 121 in the coating treatment apparatus 31.

The wafer W transferred to the resist film forming unit 121 is suction-held by the spin chuck 160. Subsequently, the resist solution nozzle 172 at the waiting section 174 is moved by the arm 171 to the position above the central portion of the wafer W. Thereafter, while the wafer W is being rotated by the spin chuck 160, the resist solution is supplied from the resist solution nozzle 172 to the central portion of the wafer W. The resist solution supplied over the wafer W is diffused over the entire front surface of the wafer W by the centrifugal force generated by the rotation of the wafer W. In this manner, the resist solution is applied over the film to be treated 400 on the wafer W to form into a resist film 401 over the wafer W as illustrated in FIG. 8(*a*). Note that the above-described lower anti-reflection film has been formed under the resist film 401 over the wafer W but its illustration is omitted in the illustrated example.

The wafer W is then transferred by the wafer transfer apparatus 70 to the thermal treatment apparatus 40 and subjected to pre-baking. The wafer W is then transferred by the wafer transfer apparatus 70 to the delivery apparatus 55.

Then, the wafer W is transferred by the wafer transfer apparatus 70 to the upper anti-reflection film forming apparatus 33, in which an upper anti-reflection film (not illustrated) is formed over the wafer W. The wafer W is then transferred by the wafer transfer apparatus 70 to the thermal treatment apparatus 40, and heated and temperature-regulated. The wafer W is then transferred by the wafer transfer apparatus 70 to the edge exposure apparatus 42, in which edge exposure processing is performed on the edge portion of the resist film 401 over the wafer W.

The wafer W is then transferred by the wafer transfer apparatus 70 to the delivery apparatus 56. The wafer W is then transferred by the wafer transfer apparatus 90 to the delivery apparatus 52 and transferred by the shuttle transfer apparatus 80 to the delivery apparatus 62.

The wafer W is then transferred by the wafer transfer apparatus 100 in the interface station 13 to the exposure apparatus 12. In the exposure apparatus 12, the resist film 401 over the wafer W is irradiated with light and thereby selectively exposed to a predetermined pattern. Then, as illustrated in FIG. 8(*b*), a pattern composed of an exposed portion 402 which has been exposed and an unexposed portion 403 which has not been exposed is formed in the resist film 401. Further, exposure of the exposed portion 402 forms OH groups (hydroxyl groups) in the exposed portion 402.

Then, the wafer W is transferred by the wafer transfer apparatus 100 from the exposure apparatus 12 to the delivery apparatus 63. Thereafter, the wafer W is transferred by the wafer transfer apparatus 70 to the metal treatment unit 120 in the coating treatment apparatus 31.

The wafer W transferred to the metal treatment unit 120 is suction-held by the spin chuck 130. Subsequently, the metal-containing solution nozzle 143 at the waiting section 145 is moved by the first arm 141 to the position above the central portion of the wafer W. Thereafter, while the wafer W is being rotated by the spin chuck 130, the metal-containing solution is supplied from the metal-containing solution nozzle 143 to the central portion of the wafer W. The metal-containing solution supplied over the wafer W is diffused over the entire front surface of the resist film 401 over the wafer W by the centrifugal force generated by the rotation of the wafer W.

Once the metal-containing solution is applied on the resist film 401 as described above, the alcohol in the metal-containing solution enters the exposed portion 402 targeting functional groups having affinity therefor such as the OH groups in the exposed portion 402 of the resist film 401. Along with the entrance of the alcohol into the exposed portion 402, metal also enters the exposed portion 402 using the alcohol as an entrance route. Then, the metal bonds with the OH groups in the exposed portion 402, and metal 404 thereby infiltrates the exposed portion 402 as illustrated in FIG. 8(*c*). Note that in this event, the metal does not enter the unexposed portion 403 but is deposited on the surface of the unexposed portion 403.

Thereafter, the metal-containing solution nozzle 143 is moved by the first arm 141 from the position above the central portion of the wafer W to the waiting section 145, and the cleaning solution nozzle 150 at the waiting section 152 is moved by the second arm 142 to the position above the central portion of the wafer W.

Subsequently, while the wafer W is being rotated by the spin chuck 130, the cleaning solution is supplied from the cleaning solution nozzle 150 to the central portion of the wafer W. The cleaning solution supplied onto the wafer W is diffused over the entire surface of the resist film 401 over the wafer W by the centrifugal force generated by the rotation of the wafer W. The cleaning solution removes the metal deposited on the unexposed portion 403 and thereby cleans the surface of the resist film 401.

Then, the wafer W is transferred by the wafer transfer apparatus 70 to the delivery apparatus 54, and thereafter transferred by the wafer transfer apparatus 23 in the cassette station 10 to the cassette C on the predetermined cassette mounting plate 21.

After the predetermined treatments are performed on the wafers W in the coating and developing treatment apparatus 2, the cassette C housing the wafers W is transferred out of the coating and developing treatment apparatus 2 and then transferred into the etching treatment apparatus 3.

In the etching treatment apparatus 3, one wafer W is first taken out of the cassette C on the cassette mounting table 212 by the wafer transfer mechanism 210 and transferred into the load-lock apparatus 213a. After the wafer W is transferred into the load-lock apparatus 213a, the inside of the load-lock apparatus 213a is hermetically closed and reduced in pressure. Thereafter, the inside of the load-lock apparatus 213a is communicated with the inside of the transfer room chamber 214 in a state reduced in pressure relative to the atmospheric pressure (for example, in a substantially vacuum state). The wafer W is then transferred by the wafer transfer mechanism 215 out of the load-lock apparatus 213a and into the transfer room chamber 214.

The wafer W transferred into the transfer room chamber 214 is then transferred by the wafer transfer mechanism 215 into the first etching apparatus 202. In the first etching apparatus 202, an etching treatment is performed on the wafer W using, for example, $O_2$ gas ($O_2$ plasma). In this event, the exposed portion 402 of the resist film 401 contains the metal 404 and is thus higher in etching resistance than the unexposed portion 403. Therefore, by performing the etching treatment on the wafer W, only the unexposed portion 403 is selectively removed and the exposed portion 402 remains. Then, as illustrated in FIG. 8(d), a predetermined resist pattern 405 (exposed portion 402) is formed over the film to be treated 400 on the wafer W.

Then, the wafer W is transferred by the wafer transfer mechanism 215 into the second etching apparatus 204. In the second etching apparatus 204, the film to be treated 400 on the wafer W is etched using, for example, CF gas (CF plasma) and using the resist pattern 405 over the wafer W as a mask. In this event, since the resist pattern 405 has a high etching selection ratio with respect to the film to be treated 400, a predetermined pattern 406 is formed in an appropriate shape in the film to be treated 400 as illustrated in FIG. 8(e).

Thereafter, the wafer W is returned again to the transfer room chamber 214 by the wafer transfer mechanism 215. Then, the wafer W is delivered to the wafer transfer mechanism 210 via the load-lock apparatus 213b and housed into the cassette C. Thereafter, the cassette C housing the wafers W is transferred out of the etching treatment apparatus 3, with which a series of wafer treatments end.

According to the above embodiment, when the resist film 401 is exposed in the exposure apparatus 12, OH groups are formed in the exposed portion 402 of the resist film 401. This allows alcohol to enter the exposed portion 402 and allows the metal 404 to enter the exposed portion 402 using the alcohol as an entrance route in the metal treatment unit 120 in the coating treatment apparatus 31. This ensures that, in the resist film 401, the exposed portion 402 contains the metal 404 and can be accordingly higher in etching resistance than the unexposed portion 403. This makes it possible to selectively remove only the unexposed portion 403 of the resist film 401 and leave the exposed portion 402 to thereby appropriately form the resist pattern 405 over the film to be treated 400 on the wafer W in the first etching apparatus 202. As described above, according to this embodiment, it is possible to omit the developing treatment using a developing solution as in the conventional photolithography processing and thereby suppress the pattern collapse of the resist pattern 405.

In addition, the resist pattern 405 in this embodiment contains the metal 404 and thus has a high etching selection ratio with respect to the film to be treated 400 on the wafer W. Accordingly, it is unnecessary to form a resist pattern 405 having a high aspect ratio and thereby can suppress the pattern collapse also from this viewpoint.

Further, the resist pattern 405 has a high etching selection ratio with respect to the film to be treated 400, so that when the film to be treated 400 is etched using the resist pattern 405 as a mask in the second etching apparatus 204, the predetermined pattern 406 can be appropriately formed in the film to be treated 400.

Further, since the metal deposited on the unexposed portion 403 is removed after the metal 404 infiltrates the exposed portion 402 of the resist film 401 in the metal treatment unit 120 in the coating treatment apparatus 31, the etching treatment in the first etching apparatus 202 thereafter can be appropriately performed. Note that the removal of the metal on the unexposed portion 403 can be performed by various methods not limited to the method of this embodiment. For example, the metal on the unexposed portion 403 may be removed by performing an etching treatment. However, in the case of using the cleaning solution nozzle 150 in the metal treatment unit 120 as in this embodiment, it is unnecessary to separately perform transfer of the wafer W and so on, resulting in improved throughput of the wafer treatment.

In the above embodiment, the infiltration amount of the metal 404 infiltrating the exposed portion 402 of the resist film 401, namely, the concentration of the metal 404 in the exposed portion 402 or the infiltration depth of the metal 404 in the exposed portion 402 is controlled by adjusting, for example, any one or all of the following four parameters. Note that by adjusting these four parameters, the infiltration speed of the metal 404 infiltrating the exposed portion 402 can also be controlled. For example, in the case of causing the metal 404 to infiltrate down to a depth of 100 nm in the exposed portion 402, the infiltration speed of the metal 404 can be controlled in a range of 30 seconds to 5 minutes.

The first parameter is, for example, an infiltration time period of the metal 404 in the metal treatment unit 120 in the coating treatment apparatus 31. Increasing the time period during which the metal-containing solution is supplied from the metal-containing solution nozzle 143 makes it possible to increase the time period during which the metal 404 is caused to infiltrate the exposed portion 402 and thereby increase the infiltration amount of the metal 404. On the other hand, decreasing the infiltration time period of the metal 404 makes it possible to decrease the infiltration amount of the metal 404.

The second parameter is, for example, a temperature of alcohol in the metal-containing solution to be supplied from the metal-containing solution nozzle 143 in the metal treatment unit 120 in the coating treatment apparatus 31. Increasing the temperature of alcohol from the metal-containing solution nozzle 143 makes the metal 404 easily infiltrate the exposed portion 402 and thereby makes it possible to increase the infiltration amount of the metal 404. On the other hand, decreasing the temperature of alcohol makes it possible to decrease the infiltration amount of the metal 404.

The third parameter is, for example, an amount of solvent in the resist film 401 to be treated in the metal treatment unit 120 in the coating treatment apparatus 31. For adjusting the amount of solvent, various methods can be used.

Foe example, at the time when thermal treatment (prebaking treatment) is performed in the thermal treatment apparatus 40 after the resist film 401 is formed over the wafer W in the resist film forming unit 121 in the coating treatment apparatus 31, the temperature or time period of the thermal treatment are adjusted, whereby the amount of solvent in the resist film 401 can be adjusted. By decreasing the temperature of the thermal treatment or the time period of the thermal treatment, the amount of solvent in the resist film 401 can be increased. This makes it possible to increase the amount of alcohol entering the exposed portion 402 of the resist film 401 and further to increase the infiltration amount of the metal 404 infiltrating the exposed portion 402. On the other hand, by increasing the temperature of the thermal treatment or the time period of the thermal treatment, the amount of solvent in the resist film 401 can be decreased. This makes it possible to decrease the amount of alcohol entering the exposed portion 402 and further to decrease the infiltration amount of the metal 404 infiltrating the exposed portion 402. Further, the decrease of the amount of solvent in the resist film 401 can also provide the effect of surely suppressing the entrance of metal into the unexposed portion 403.

Further, a solvent may be supplied to the resist film 401, for example, in a solvent supply apparatus (not illustrated) that is separately provided, to aggressively increase the amount of solvent in the resist film 401. Further, the amount of solvent in the resist film 401 may be adjusted by changing, for example, the material of the resist solution to be supplied from the resist solution nozzle 172 in the resist film forming unit 121.

The fourth parameter is, for example, an exposure amount (dose amount) in the exposure apparatus 12. By increasing the exposure amount, more OH groups are formed in the exposed portion 402 of the resist film 401. This makes it possible to increase the amount of alcohol entering the exposed portion 402 and further to increase the infiltration amount of the metal 404 infiltrating the exposed portion 402. On the other hand, by decreasing the exposure amount, less OH groups are formed in the exposed portion 402. This makes it possible to decrease the amount of alcohol entering the exposed portion 402 and further to decrease the infiltration amount of the metal 404 infiltrating the exposed portion 402.

The infiltration amount of the metal 404 infiltrating the exposed portion 402 of the resist film 401 can be controlled as described above. Though the metal 404 is caused to infiltrate the whole exposed portion 402 including the upper portion to the lower portion thereof as illustrated in FIG. 8(c) in the above embodiment, the infiltration amount of the metal 404 may be adjusted to cause the metal 404 to infiltrate only the upper portion of the exposed portion 402 as illustrated in FIG. 9(a). Also in this case, the upper portion of the exposed portion 402 is higher in etching resistance than the unexposed portion 403, so that when the etching treatment is performed in the first etching apparatus 202, only the unexposed portion 403 can be selectively removed to form the predetermined resist pattern 405 over the film to be treated 400 on the wafer W as illustrated in FIG. 9(b). Further, the upper portion of the exposed portion 402 has a high etching selection ratio with respect to the film to be treated 400, so that when the etching treatment is performed in the second etching apparatus 204, the predetermined pattern 406 can be formed in an appropriate shape in the film to be treated 400 as illustrated in FIG. 9(c). Accordingly, the same effect as that in the above embodiment can be provided.

Further, the infiltration amount of the metal 404 infiltrating the exposed portion 402 can be controlled in accordance with the etching selection ratio required for the etching treatment in the second etching apparatus 204 as described above. Therefore, the etching treatment can be more appropriately performed.

Figure 9:
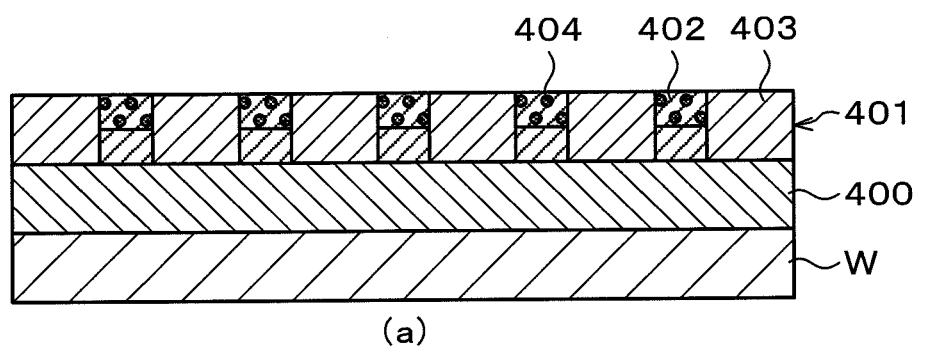
FIG. 9 is an explanatory view of a wafer treatment according to another embodiment, (a) illustrating an appearance in which metal infiltrates an upper portion of an exposed portion of a resist film, (b) illustrating an appearance in which a resist pattern is formed over a wafer, and (c) illustrating an appearance in which a predetermined pattern is formed in a film to be treated.
Figure 9:
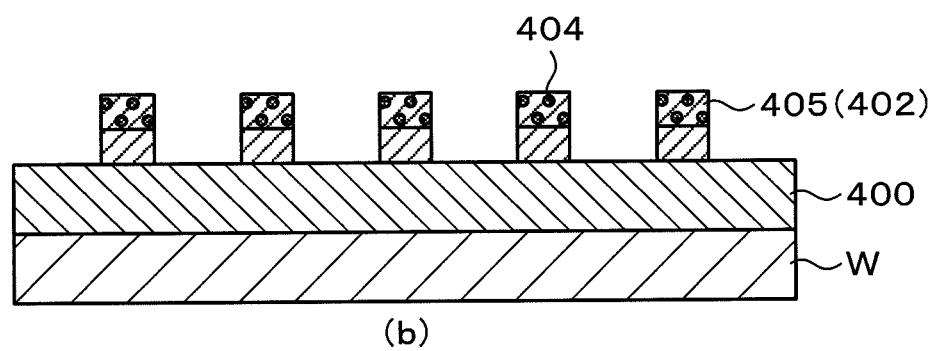
Figure 9:
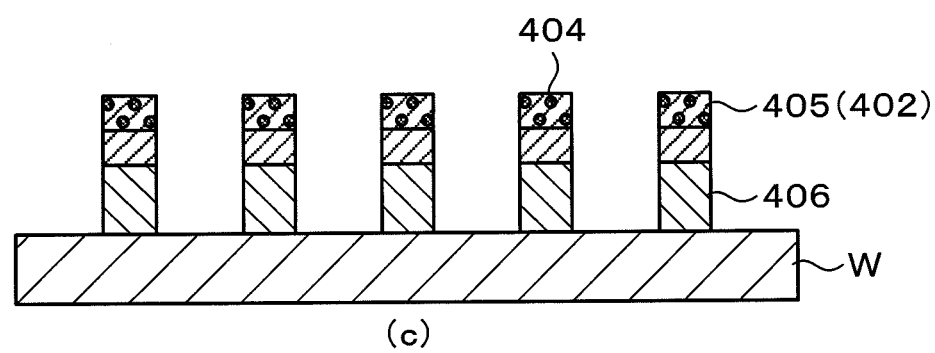

Note that since the metal 404 does not infiltrate the lower portion of the exposed portion 402 in the example illustrated in FIG. 9, also the lower portion of the exposed portion 402 may be slightly etched in the etching treatment in the first etching apparatus 202 and the second etching apparatus 204. Accordingly, from this viewpoint, it is more preferable to cause the metal 404 to infiltrate the whole exposed portion 402 as illustrated in FIG. 8 because the etching treatment can be more appropriately performed.

Though the metal-containing solution made by dissolving the metal 404 in alcohol is supplied onto the wafer W at the time when the metal 404 is caused to infiltrate the exposed portion 402 of the resist film 401 in the metal treatment unit 120 in the coating treatment apparatus 31 in the above embodiment, the alcohol and the metal 404 may be separately supplied onto the wafer W.

Figure 10:
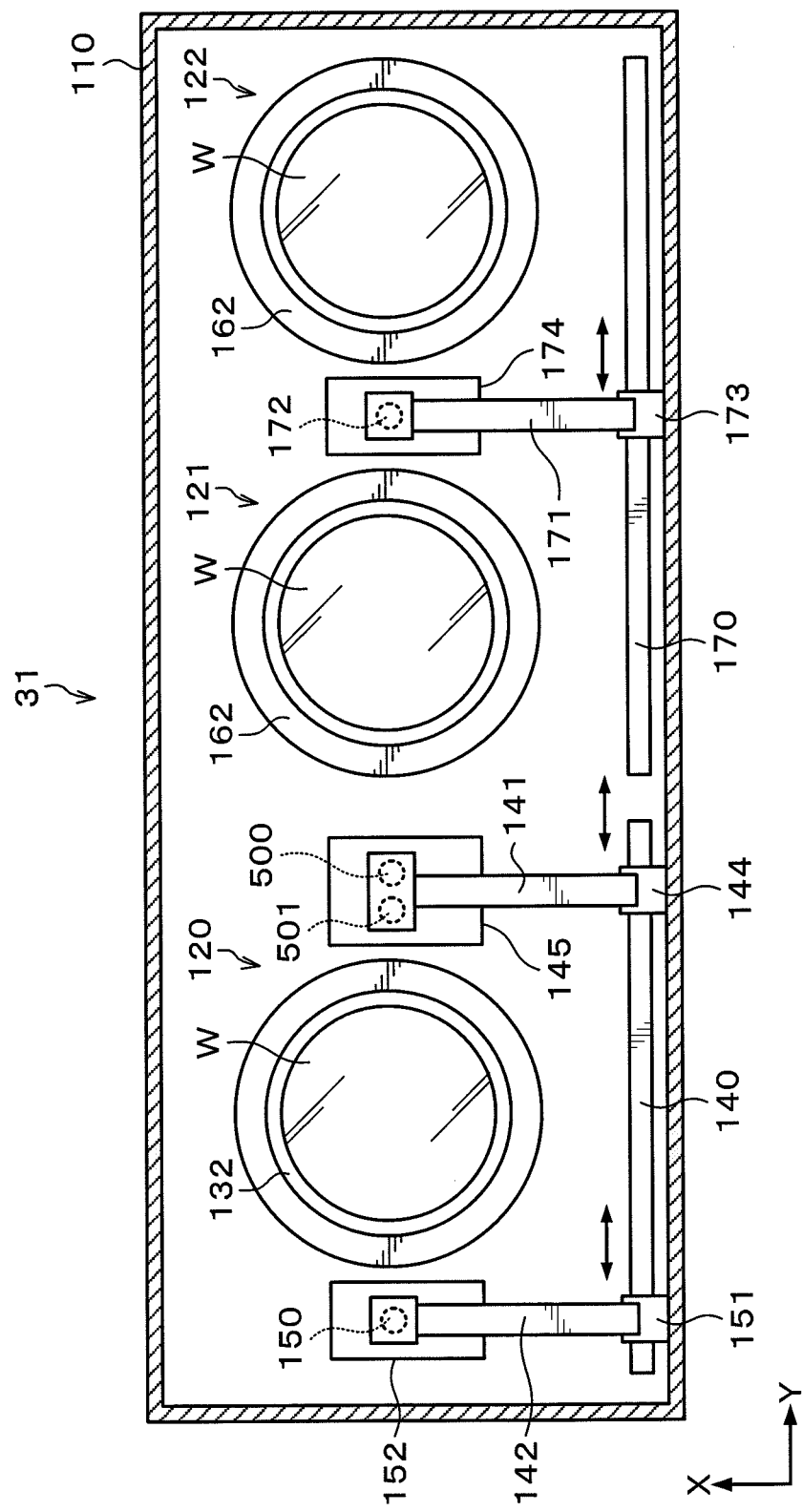
FIG. 10 is a transverse sectional view illustrating the outline of a configuration of a coating treatment apparatus according to another embodiment.
Figure 11:
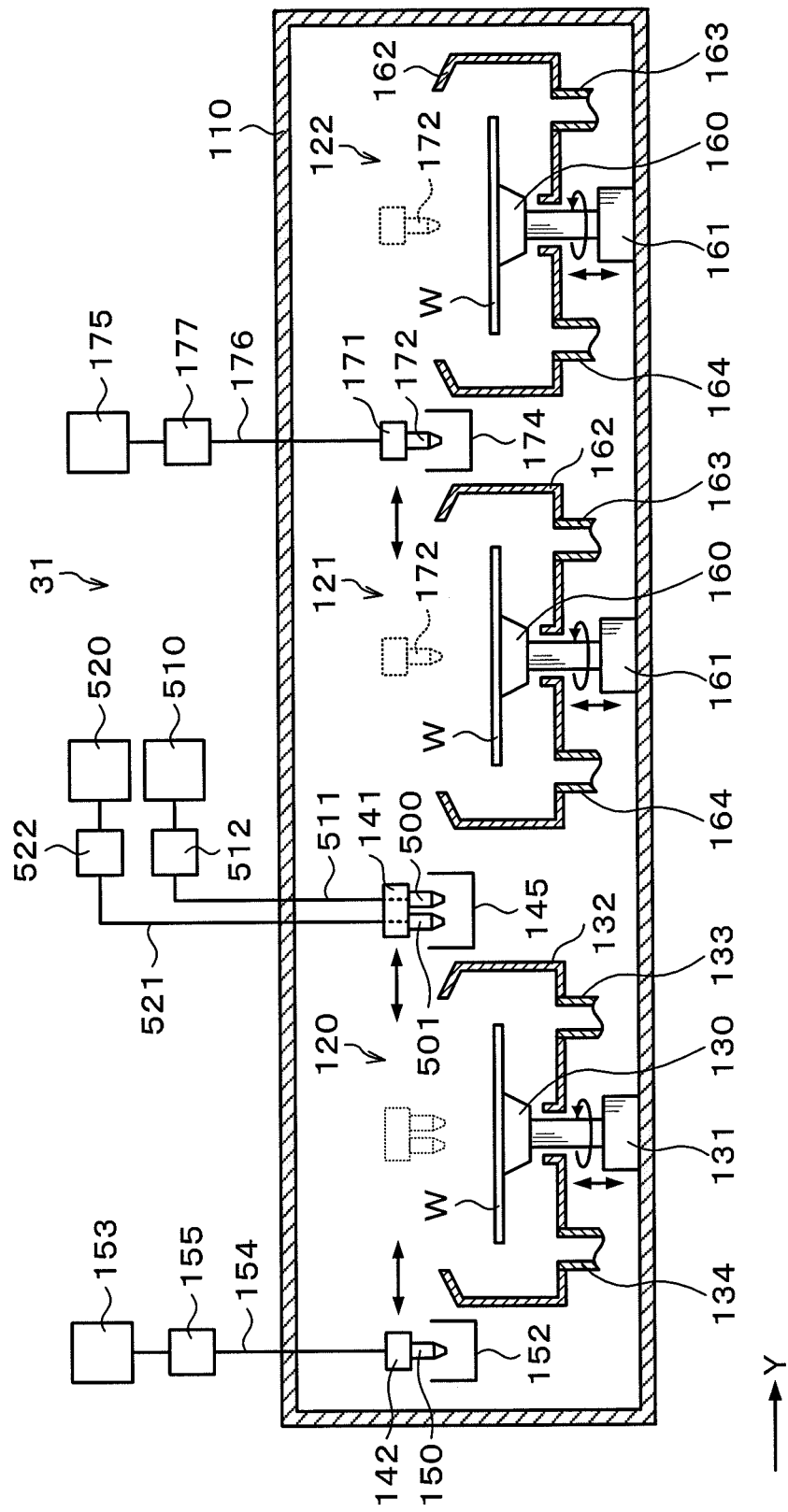
FIG. 11 is a longitudinal sectional view illustrating the outline of the configuration of the coating treatment apparatus according to another embodiment.

As illustrated in FIG. 10 and FIG. 11, an alcohol nozzle 500 as a treatment agent supply part that supplies alcohol in a liquid form as a treatment agent onto the wafer W and a metal-containing solution nozzle 501 as a metal-containing agent supply part that supplies a metal-containing solution in a liquid form as a metal-containing agent containing the metal 404 onto the wafer W are supported on the first arm 141 in the metal treatment unit 120.

To the alcohol nozzle 500, a supply pipe 511 communicating with an alcohol supply source 510 is connected as illustrated in FIG. 11. The supply pipe 511 is provided with a supply equipment group 512 including a valve, a flow regulator and so on for controlling the flow of the alcohol. Note that as the alcohol, the same alcohol as in the above embodiment is used.

To the metal-containing solution nozzle 501, a supply pipe 521 communicating with a metal-containing solution supply source 520 is connected. The supply pipe 521 is provided with a supply equipment group 522 including a valve, a flow regulator and so on for controlling the flow of the metal-containing solution. Note that as the metal 404 in the metal-containing solution, the same metal as in the above embodiment is used, but various solvents can be used as the solvent therefor. As the solvent, various materials such as pure water can be used as long as the material dissolves the metal 404 and never dissolves the resist film 401.

The other configuration of the metal treatment unit 120 is the same as that of the metal treatment unit 120 in the above embodiment, and therefore description thereof is omitted. Note that the alcohol nozzle 500 and the metal-containing solution nozzle 501 are supported on the same first arm 141 in the above configuration, but may be supported on separate arms. Further, the cleaning solution nozzle 150 is provided on the second arm 142 in the above embodiment, but in the case of using alcohol as the cleaning solution, the alcohol nozzle 500 may be used to remove the metal on the unexposed portion 403 to thereby clean the surface of the resist film 401. In this case, the cleaning solution nozzle 150 and members accompanying therewith (the second arm 142, the nozzle drive part 151, the waiting section 152, the cleaning solution supply source 153, the supply pipe 154, and the supply equipment group 155) can be omitted.

In the metal treatment unit 120 of this embodiment, after the wafer W is suction-held by the spin chuck 130, the alcohol nozzle 500 at the waiting section 145 is moved by the first arm 141 to the position above the central portion of the wafer W. Subsequently, while the wafer W is being rotated by the spin chuck 130, alcohol is supplied from the alcohol nozzle 500 to the central portion of the wafer W. The alcohol supplied over the wafer W is diffused over the entire surface of the resist film 401 over the wafer W by the centrifugal force generated by the rotation of the wafer W.

Figure 12:
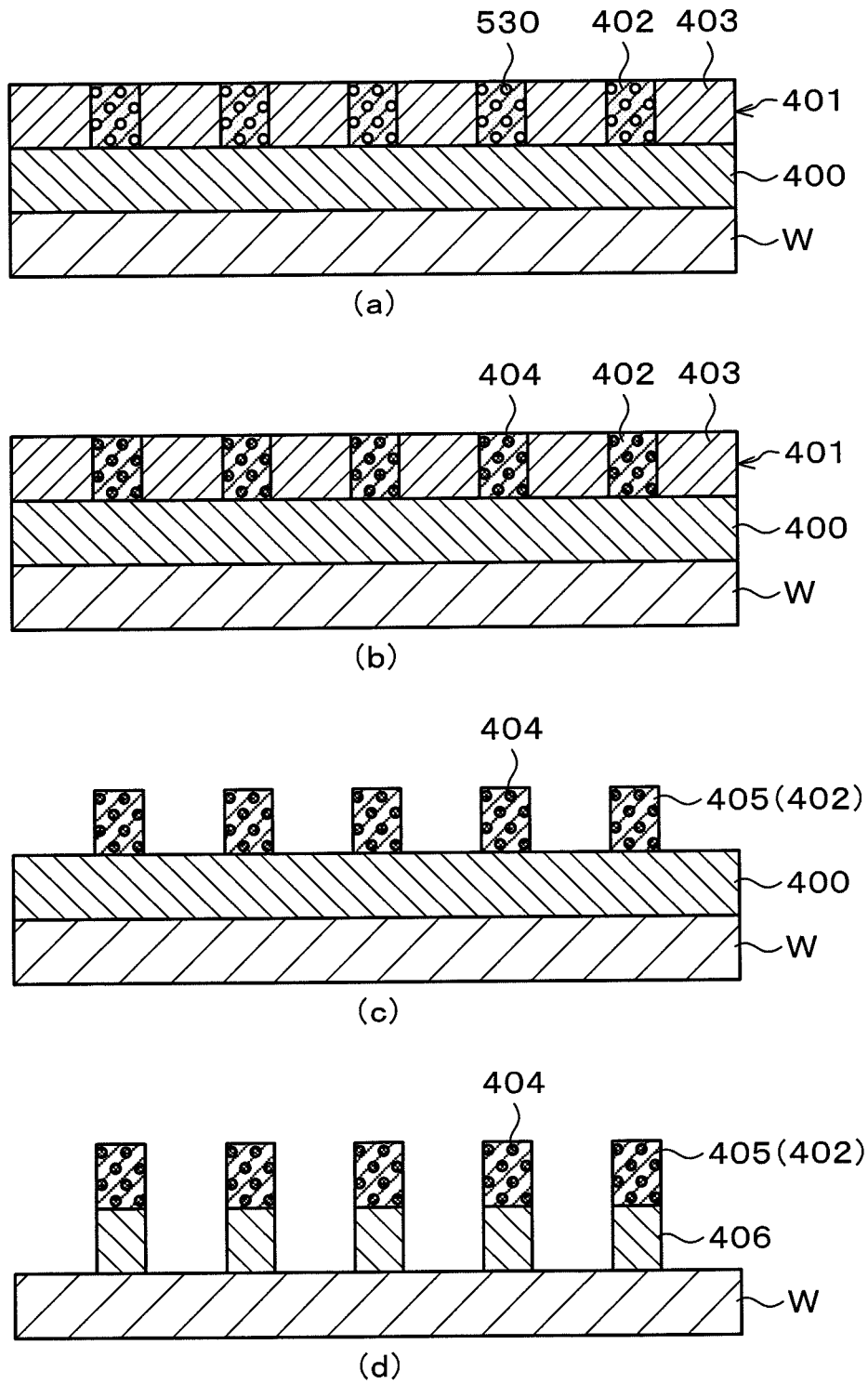
FIG. 12 is an explanatory view of a wafer treatment according to another embodiment, (a) illustrating an appearance in which alcohol infiltrates an exposed portion of a resist film, (b) illustrating an appearance in which metal infiltrates the exposed portion, (c) illustrating an appearance in which a resist pattern is formed over a wafer, and (d) illustrating an appearance in which a predetermined pattern is formed in a film to be treated.

In this manner, when alcohol is applied on the resist film 401, alcohol 530 enters the exposed portion 402 targeting functional groups having affinity therefor such as the OH groups in the exposed portion 402 of the resist film 401 as illustrated in FIG. 12(*a*).

Thereafter, the metal-containing solution nozzle 501 is moved by the first arm 141 to the position above the central portion of the wafer W. Subsequently, while the wafer W is being rotated by the spin chuck 130, the metal-containing solution is supplied from the metal-containing solution nozzle 501 to the central portion of the wafer W. The metal-containing solution supplied over the wafer W is diffused over the entire surface of the resist film 401 over the wafer W by the centrifugal force generated by the rotation of the wafer W.

When the metal-containing solution is applied on the resist film 401 as described above, the metal-containing solution enters the exposed portion 402 using the alcohol 530 in the exposed portion 402 as an entrance route. Then, the metal 404 in the metal-containing solution bonds with the OH groups in the exposed portion 402, and the metal 404 infiltrates the exposed portion 402 as illustrated in FIG. 12(*b*).

Also in this case, the exposed portion 402 is higher in etching resistance than the unexposed portion 403, so that when the etching treatment is performed in the first etching apparatus 202, only the unexposed portion 403 can be selectively removed to form the predetermined resist pattern 405 over the film to be treated 400 on the wafer W as illustrated in FIG. 12(*c*). Further, the exposed portion 402 has a high etching selection ratio with respect to the film to be treated 400, so that when the etching treatment is performed in the second etching apparatus 204, the predetermined pattern 406 can be formed in an appropriate shape in the film to be treated 400 as illustrated in FIG. 12(*d*). Accordingly, the same effect as that in the above embodiment can be provided.

For causing the metal 404 to infiltrate the exposed portion 402 as described above, the metal-containing solution made by dissolving the metal 404 in the alcohol 530 may be supplied onto the wafer W, or the alcohol 530 and the metal 404 may be separately supplied onto the wafer W, in any of which cases, the same effect can be provided. Incidentally, it is more preferable to supply the metal-containing solution made by dissolving the metal 404 in the alcohol 530 onto the wafer W as in the former case from the viewpoint of throughput.

The metal-containing solution supplied from the metal-containing solution nozzle 143 to the wafer W is in a liquid form in the above embodiment but may be in a gas form. A coating treatment apparatus 600 that supplies the metal-containing agent in the gas form can be installed at any place in the coating and developing treatment apparatus 2, and installed, for example, in the first block G1.

Figure 13:
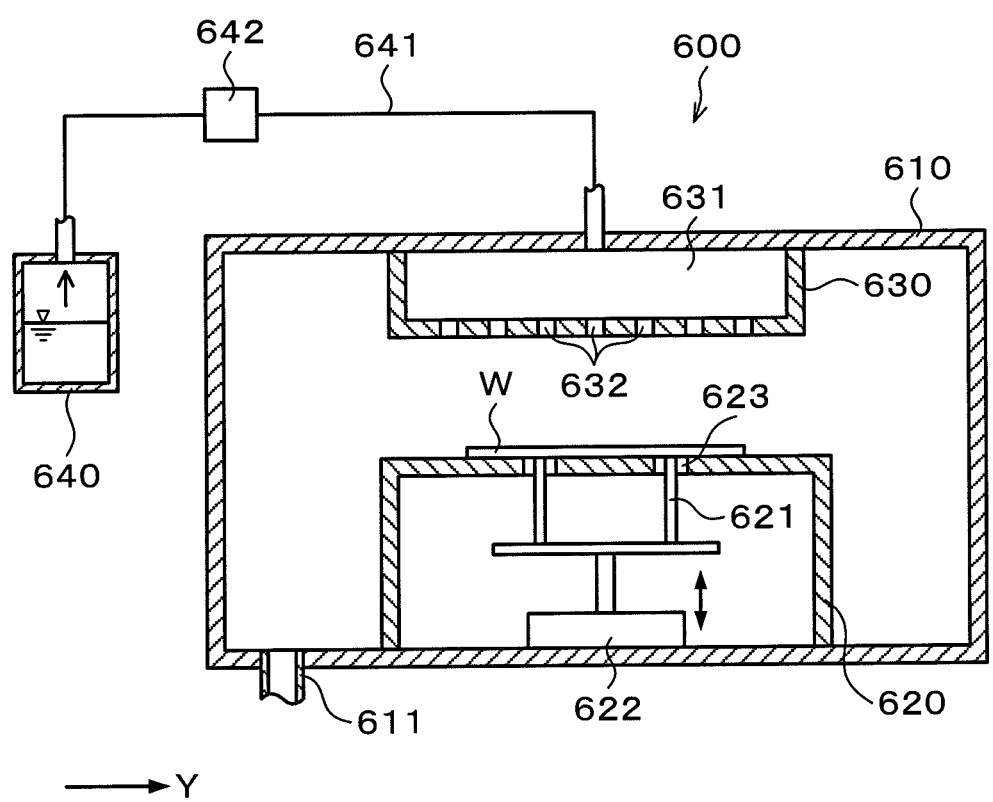
FIG. 13 is a longitudinal sectional view illustrating the outline of a configuration of a coating treatment apparatus according to another embodiment.

The coating treatment apparatus 600 has a treatment container 610 which can hermetically close the inside as illustrated in FIG. 13. A transfer-in/out port (not illustrated) for the wafer W is formed, for example, in a side surface on the wafer transfer region D side of the treatment container 610, and an opening/closing shutter (not illustrated) is provided at the transfer-in/out port. To the bottom surface of the treatment container 610, an exhaust pipe 611 that exhausts the atmosphere therein is connected.

At the bottom surface in the treatment container 610, a mounting table 620 on which the wafer W is mounted is provided. In the mounting table 620, for example, three raising and lowering pins 621 are provided for supporting the wafer W from below and raising and lowering the wafer W. The raising and lowering pins 621 can move up and down by means of a raising and lowering drive part 622. In the upper surface of the mounting table 620, through holes 623 penetrating the upper surface in the thickness direction are formed, for example, at three positions. The raising and lowering pins 621 are inserted into the through holes 623.

On the ceiling surface in the treatment container 610 and above mounting table 620, a shower head 630 that supplies a metal-containing agent in a gas form downward onto the wafer W is provided. The shower head 630 is arranged to face the wafer W mounted on the mounting table 620. Inside the shower head 630, an inner space 631 is formed into which the metal-containing agent supplied from a later-described metal-containing agent supply source 640 is introduced. At the lower surface of the shower head 630, a plurality of supply ports 632 that supply downward the metal-containing agent introduced into the inner space 631 are provided, distributed over the entire lower surface of the shower head 630. In short, the plurality of supply ports 632 are formed so that the metal-containing agent in a gas form is supplied from the shower head 630 to the wafer W uniformly within the horizontal plane.

To the shower head 630, a supply pipe 641 communicating with a metal-containing agent supply source 640 is connected. In the metal-containing agent supply source 640, the already-described metal-containing solution made by dissolving the metal 404 in the alcohol 530 is stored in a liquid form, and the metal-containing solution is heated to evaporate so as to form into the metal-containing agent in a gas form. The supply pipe 641 is provided with a supply equipment group 642 including a valve, a flow regulator and so on for controlling the flow of the metal-containing agent.

In this case, the wafer W on which the resist film 401 has been formed is transferred by the wafer transfer apparatus 70 to the coating treatment apparatus 600. After the wafer W is transferred into the coating treatment apparatus 600, the wafer W is delivered to the raising and lowering pins 621 which have been raised and waiting in advance. Subsequently, the raising and lowering pins 621 are lowered to mount the wafer W on the mounting table 620. Thereafter, the metal-containing agent in a gas form is supplied from the shower head 630 onto the wafer W. Then, the alcohol 530 enters the exposed portion 402 of the resist film 401, and the metal 404 enters the exposed portion 402 using the alcohol 530 as an entrance route. This makes it possible to cause the metal 404 to infiltrate the exposed portion 402.

Similarly, each of the alcohol 530 supplied from the alcohol nozzle 500 and the metal-containing solution supplied from the metal-containing solution nozzle 501 is in a liquid form but may be in a gas form. Even in this case, the same apparatus as the coating treatment apparatus 600 can be used to supply the alcohol 530 in a gas form and the metal-containing agent in a gas form onto the wafer W to thereby cause the metal 404 to infiltrate the exposed portion 402 of the resist film 401.

The metal treatment unit 120 and the resist film forming units 121, 122 are provided in the same coating treatment apparatus 31 in the above embodiment, but may be provided in separate apparatuses.

Though alcohol is used as a treatment agent to cause the metal 404 to enter the exposed portion 402 of the resist film 401 in the above embodiment, the material is not limited to alcohol as long as the material enters the exposed portion 402.

Though the unexposed portion 403 of the resist film 401 is removed in the first etching apparatus 202 and the film to be treated 400 is etched in the second etching apparatus 204 in the above embodiment, the removal of the unexposed portion 403 and the etching treatment on the film to be treated 400 may be performed in the same etching apparatus by switching the etching gas.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention.

What is claimed is:

1. A substrate treatment method of forming a resist pattern over a substrate, the method comprising:
    a resist film forming step of forming a resist film over a substrate;
    an exposure step of exposing the resist film into a predetermined pattern;
    a metal treatment step of causing a treatment agent to enter an exposed portion exposed in the exposure step of the resist film and causing metal to infiltrate the exposed portion via the treatment agent, wherein the treatment agent is alcohol; and
    a resist film removing step of removing an unexposed portion not exposed in the exposure step of the resist film to form a resist pattern over the substrate,
    wherein an infiltration amount of the metal infiltrating the exposed portion in the metal treatment step is controlled by adjusting at least a time period during which the metal is caused to infiltrate in the metal treatment step, an amount of solvent in the resist film treated in the metal treatment step, or an exposure amount in the exposure step,
    wherein the metal treatment step, the treatment agent is supplied onto the resist film and the treatment agent is caused to enter the exposed portion, and then a metal-containing agent containing the metal is supplied onto the resist film so as to cause the metal to infiltrate the exposed portion.

2. The substrate treatment method according to claim 1, wherein in the metal treatment step, after the metal is caused to infiltrate the exposed portion, metal deposited on the unexposed portion is removed.

3. The substrate treatment method according to claim 1, wherein in the metal treatment step, the treatment agent and the metal-containing agent are supplied each in a liquid form or in a gas form onto the resist film.

4. The of claim 1, wherein the alcohol of the treatment agent is IPA (isopropyl alcohol), ethanol, butanol, MIBC (methyl isobutyl carbinol).

* * * * *